(12) United States Patent
Badcock et al.

(10) Patent No.: US 6,361,330 B1
(45) Date of Patent: Mar. 26, 2002

(54) MOUNTING OPTO-ELECTRIC MODULES ON CIRCUIT BOARDS

(75) Inventors: Mark J Badcock, Essex Fells; John Philip Franey, Bridgewater; Robert D Yadvish, Bayonne, all of NJ (US); Michael A. Zimmerman, North Andover, MA (US)

(73) Assignee: Lucent Technologies Inc., Murrray Hill, NJ (US)

( * ) Notice: Subject to any disclaimer, the term of this patent is extended or adjusted under 35 U.S.C. 154(b) by 0 days.

(21) Appl. No.: 09/680,355

(22) Filed: Oct. 5, 2000

(51) Int. Cl.⁷ .............................................. H01R 12/00
(52) U.S. Cl. ....................... 439/79; 361/807; 439/552
(58) Field of Search ............................. 439/79, 80, 57, 439/567, 552, 544, 761; 361/736, 743, 760, 763, 784, 792, 807, 809, 810, 825; 220/4.02; 206/724, 725, 701, 722, 723

(56) References Cited

U.S. PATENT DOCUMENTS

| | | | | |
|---|---|---|---|---|
| 3,676,746 A | * | 7/1972 | Kassabgi et al. | 361/796 |
| 4,556,264 A | * | 12/1985 | Tanaka | 439/62 |
| 5,194,010 A | * | 3/1993 | Dambach et al. | 439/79 |
| 5,802,711 A | * | 9/1998 | Card et al. | 29/840 |

* cited by examiner

Primary Examiner—Tulsidas Patel
(74) Attorney, Agent, or Firm—John F. McCabe (57) ABSTRACT

An opto-electric apparatus includes a circuit board, an opto-electric converter module with a plurality of electrical leads, a holder rigidly holding the opto-electric converter module, and a connection structure. The holder is rigidly fixed to the circuit board, and the connection structure is rigidly connected to the holder. The leads of the module protrude into holes in the structure. The structure electrically connects the circuit board to the leads.

20 Claims, 9 Drawing Sheets

MOUNTING OPTO-ELECTRIC MODULES ON CIRCUIT BOARDS

BACKGROUND OF THE INVENTION

1. Field of the Invention

This invention relates to mounting fragile opto-electric modules.

2. Discussion of the Related Art

In asynchronous transfer mode-passive optical networks (ATM-PONs), optical server units (OSUs) and optical node units (ONUs) use transceiver modules. The transceiver modules interconvert optical and electrical signals to support bi-directional, full-duplex communications over an optical fiber. Each transceiver module houses a laser diode for transmitting, a pin diode for receiving, a monitoring diode, and an optical filter for separating transmitted and received data messages.

Connecting a transceiver module to a circuit board of an OSU or ONU is complicated, because the module has glass bead packings that electrically insulate the module's electrical leads. The glass bead packings are easily damaged if the module's electrical leads are excessively bent or twisted during mounting of the module. Damage to the packings eventually damages the internal laser diode and/or monitoring diode and degrades performance of the transceiver module. To avoid such damage, transceiver modules need to be skillfully mounted on circuit boards in a manner that reduces risks of applying above-threshold stresses to the packings.

The transceiver modules used by OSUs and ONUs are examples of opto-electric converter modules. Herein, an opto-electric converter module is an encapsulated structure with a rigid housing, i.e., a metal housing, on which electrical and optical interfaces are located. The opto-electric converter module receives a signal of one type, i.e., electrical or optical, from an input interface and transmits a signal of another type, i.e., optical or electrical, at an output interface. Different opto-electric converter modules function as optical receivers, transmitters, or transceivers.

BRIEF SUMMARY OF THE INVENTION

In one aspect, the invention features a process for mounting an opto-electric module. The process includes rigidly fixing the opto-electric converter module to a holder and electrically connecting the module to a connection structure that is configured to slidably receive electrical leads of the module. The process also includes rigidly fixing the holder to a circuit board and then, electrically connecting the connection structure to the circuit board. The holder and connection structure are configured to limit bending stresses on the electrical leads during the acts of fixing the holder and electrically connecting the connection structure, respectively.

In another aspect, the invention features an opto-electric apparatus. The apparatus includes a circuit board, an opto-electric converter module with a plurality of electrical leads, a holder rigidly holding the opto-electric converter module, and a connection structure. The holder is rigidly fixed to the circuit board and the connection structure is rigidly connected to the holder. The leads of the module protrude into holes in the connection structure. The structure electrically connects the circuit board to the electrical leads.

DETAILED DESCRIPTION OF THE INVENTION

Various embodiments connect an opto-electric module to a circuit board by sliding the module's electrical leads into connection structures so that the electrical leads are not subject to bending stresses. Using sliding motions to connect the electrical leads reduces risks of such bending stresses damaging fragile components of the module, e.g., insulating glass bead packings, during mounting of the module.

Various embodiments provide automated processes for mounting opto-electric modules on circuit boards. The automated processes precision solder the modules' electrical leads to the circuit boards so that soldered lead lengths vary by less than 1 millimeter (mm) for different mounted modules. The uniformity of soldered lead lengths decreases variations in input and/or output impedances of the mounted modules below values obtainable through manual mounting processes that require bending of the electrical leads.

FIGS. 1A–8B show apparatus for mounting a particular transceiver module on a transceiver circuit board. Other embodiments mount other types of opto-electric converter modules, e.g., optical transmitters or optical receivers, on other circuit boards.

Figure 1A:
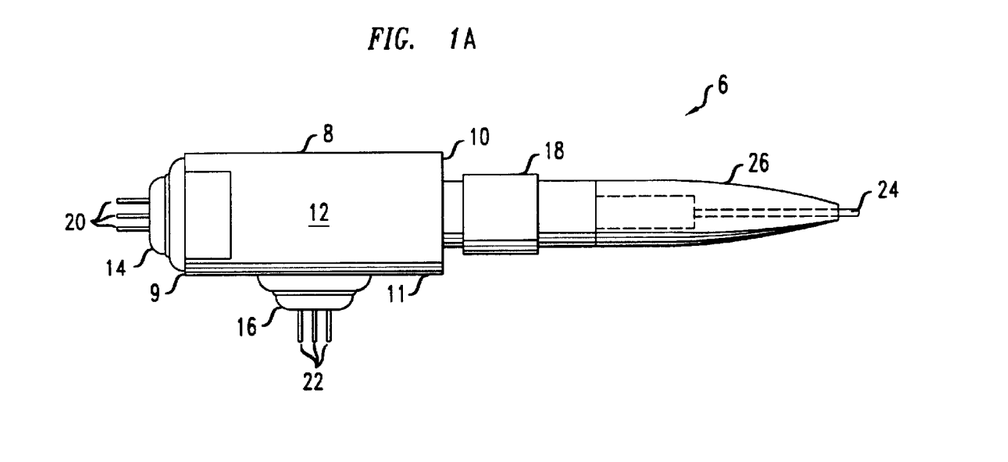
FIGS. 1A, 1B, and 1C are top, side, and end views of one opto-electric converter module.

FIG. 1A is a top view of one opto-electric converter module 6, i.e., a BIDI™ model SBH92344x FSAN optical transceiver produced by Siemens, Inc. The module 6 has a rectangular metal housing 8 whose length and width are about 2.0 and 1.0 cm, respectively. The housing 8 has end and side surfaces 9, 10, 11 from which electrical and optical interfaces 14, 18, 16 protrude. The housing 8 also has a flat top surface 12. The protruding electrical interfaces 14, 16 have protruding electrical leads 20, 22. The optical interface 18 has a mechanical structure for connecting an optical transmission fiber 24, e.g., a fiber connecting the module to another optical transceiver (not shown). The proximal end of the fiber 24 and a portion of the interface 18 are covered by a protective plastic collar 26. The interfaces 14, 16, 18 route electrical and optical communications between the opto-electric converter module 6 and external electrical and optical devices (not shown).

Figure 1B:
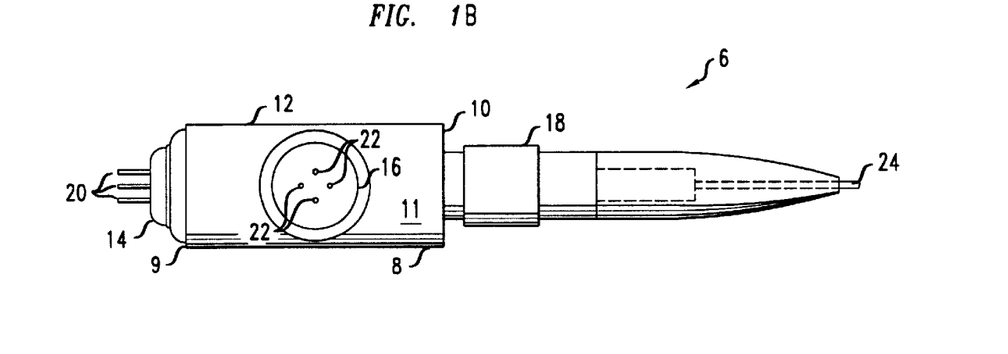
Figure 1C:
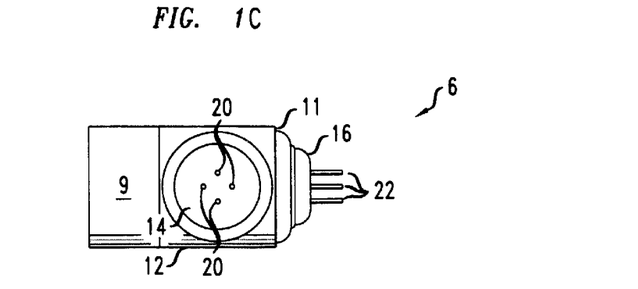

FIGS. 1B and 1C are respective side and end views of opto-electric converter module 6 of FIG. 1A. The side and end views show receiver and transmitter electrical interfaces 16, 14 and associated fragile electrical leads 22, 20.

Figure 2:
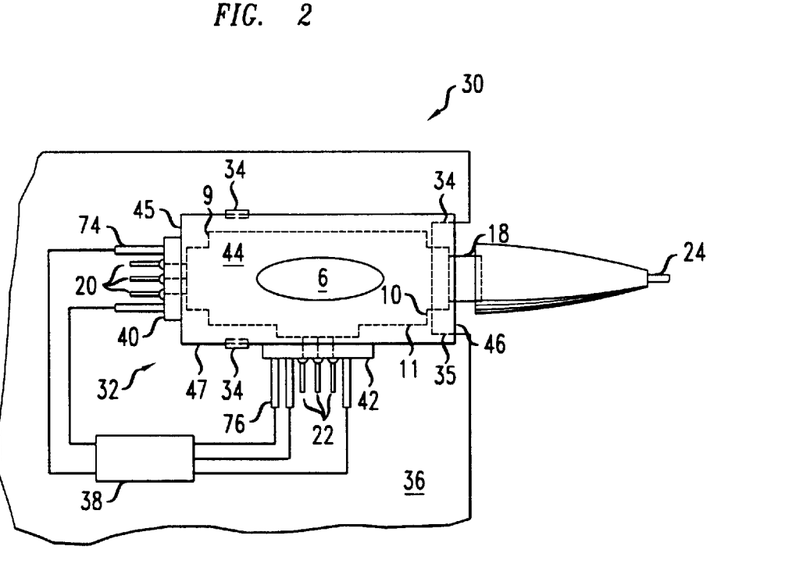
FIG. 2 is a top view of one optical transceiver that uses the opto-electric converter module of FIGS. 1A–1C.

FIG. 2 is a top view of a portion of an optical transceiver 30 that uses opto-electric converter module 6 of FIGS. 1A–1C. The module 6 is immovably engaged in a cavity of a rectangular plastic holder 32. The holder 32 is locked into slot-like openings 34–35 on transceiver circuit board 36. The holder 32 mechanically mounts the opto-electric converter module 6 to the circuit board 36. After mounting, the module 6 has a fixed height and lateral position on the circuit board 36, and the mounted module does not move relative to the circuit board 36 even if the board 36 is physically shaken. Electrical leads 20, 22 of the optical transceiver 30 pass through holes in plastic, rectangular connection boards 40, 42, which are adapted to receive the leads 20, 22 without lead bending. Lead-receiving holes on the boards 40, 42 line up with lead patterns on faces of electrical interfaces 14, 16 so that the boards 40, 42 can slidably receive the electrical leads 20, 22 without bending or twisting. The boards 40, 42 slide onto both the leads 20, 22 and alignment pins 78, 80 (see FIGS. 7, 8A–8B) without lead bending. The connection boards 40, 42 electrically connect the leads 20, 22 to external circuitry 38 located on the transceiver circuit board 36.

Mounting of the holder 32 and connection boards 40, 42 on circuit board 36 does not entail bending or twisting of leads 20, 22. The holder 32 and circuit boards 40,42 have physical structures to keep the boards 40, 42 immovably attached to the holder 32 and thereby limit or remove bending stresses on the electrical leads 20, 22 during the mounting of the holder 32 and the connection boards on the circuit board 36. Using the holder 32 and connection boards 40, 42 to mount the module 6 reduces risks of damaging glass bead packings inside the module 6, because the leads 20, 22 are not bent during the mounting.

In other embodiments, connection boards 40, 42 may be replaced with other connection structures with different shapes. Those connection structures have at least one flat face configured to rest against surface 45, 47 of the holder 32 and another flat face configured to rest on the surface of transceiver circuit board 36.

FIGS. 3–6 provide various views of rectangular plastic holder 32 that is machined or molded of a plastic material. The plastic material can provide for discharge of electrostatic charges that accumulate on module 6. For example the holder 32 may be manufactured from the static-discharge plastic described in U.S. Pat. 5,154,886 or manufactured by Engineering Materials Inc., 113 McHenry Rd., Suite #179, Buffalo Grove, Ill. 60089 (www.staticintercept.com) under the name STATIC INTERCEPT™.

Figure 3:
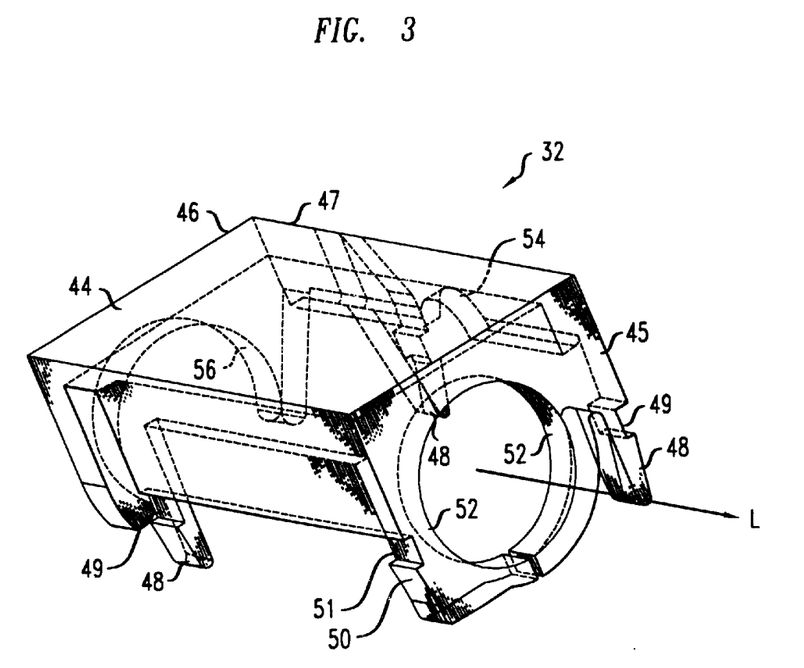
FIG. 3 is an oblique view showing top and end surfaces of a rectangular plastic holder for the opto-electric converter module of FIGS. 1A–1C, 2.

FIG. 3 is an oblique view of rectangular plastic holder 32 of FIG. 2 from top surface and end surfaces 44, 45. The housing 32 has two flexible plastic tabs 48 and two rigid edges 50. The tabs 48 and edges 50 have notches 49, 51 that lock into slots 34 and 35 on transceiver circuit board 36. The rectangular holder 32 is rigidly fixed against the transceiver circuit board 36 after locking of the tabs 48 and edges 50 into the slots 34–35.

The rectangular holder 32 has arc-shaped interfaces 52, 54, and 56 that mechanically engage circular outer surfaces of electrical and optical interfaces 14, 16, and 18 of optoelectric converter module 6 to rigidly fix the module 6 in the holder 32. When physically engaged, the interfaces 52, 56 snugly hold the coaxial electrical and optical interfaces 18, 14 stopping movement of module 6 lateral to axis L. The interface 52 has a flexible split-ring construction that allows the interface 52 to expand during insertion of the electrical interface 14. When physically engaged around interface 18, the interface 54 stops counterclockwise rotations of the module 6 about axis "L". After being engaged, the interfaces 52, 54, 56 inhibit relative movement between the rectangular housing 32 and the opto-electric converter module 6.

Figure 4:
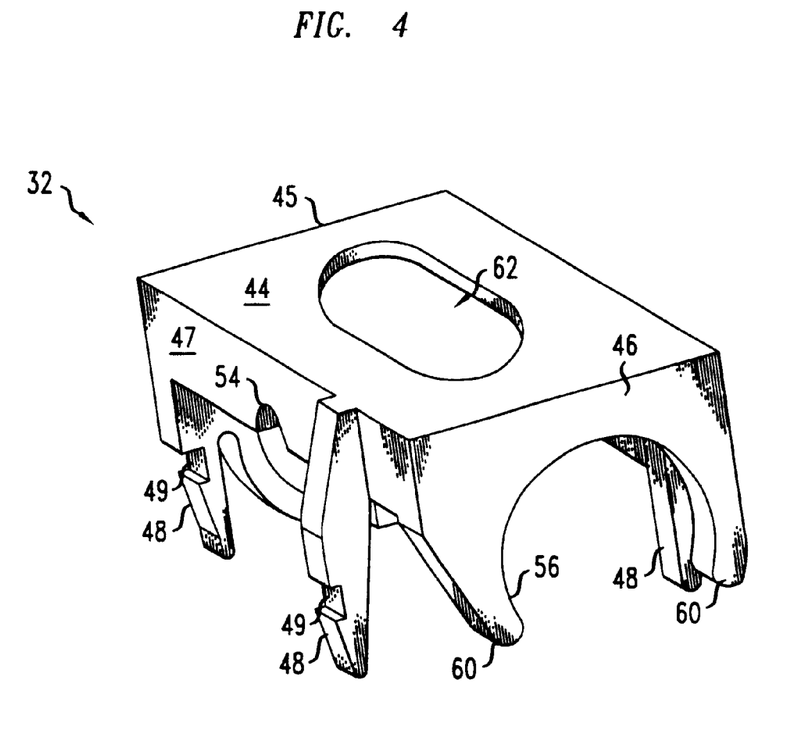
FIG. 4 is an oblique view showing end and top surfaces of the holder for the opto-electric converter module of FIGS. 1A–1C, 2.

FIG. 4 is an oblique view of the holder 32 from end and top surfaces 46, 44. End surface 46 includes arc-shaped interface 56, which mechanically engages the cylindrical outer surface of optical interface 18 on opto-electric module 6. The interface 56 has two arms 60 that bend outward during insertion of the optical interface 18 into the interface 56.

FIG. 4 also shows a cooling hole 62 that pierces top surface 44 of rectangular holder 32. The cooling hole 62 dissipates heat generated by opto-electric converter module 6 during operation.

Figure 5:
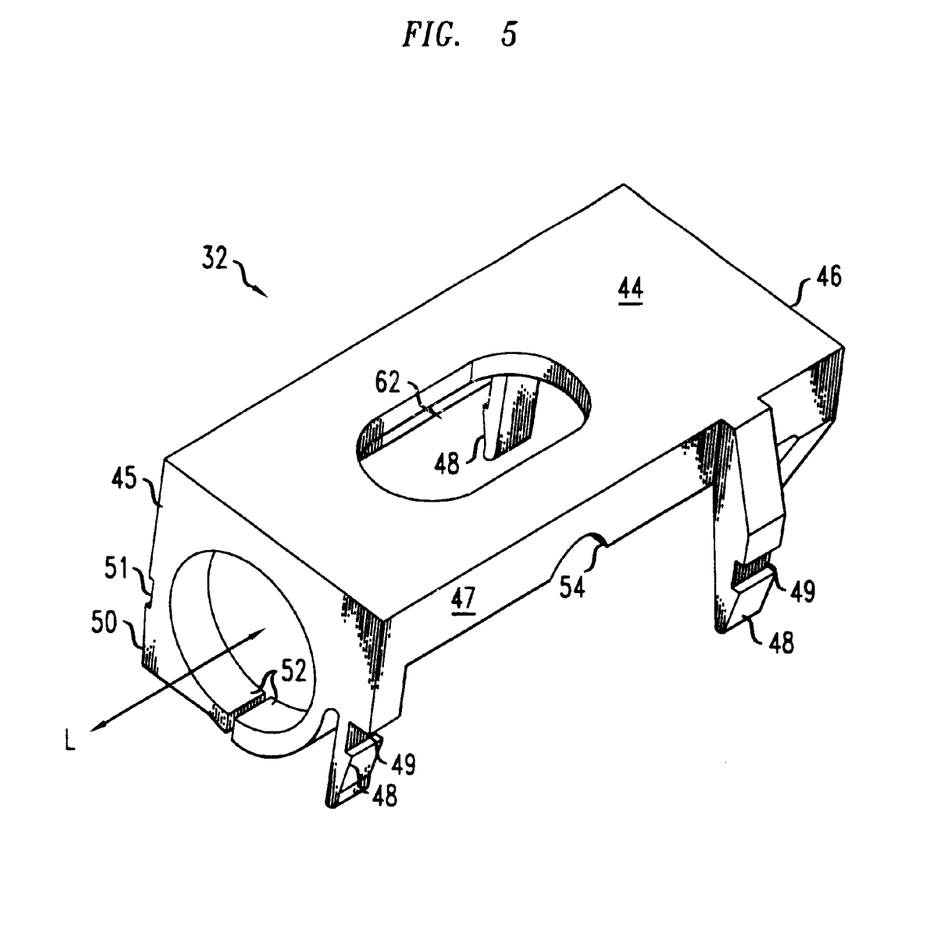
FIG. 5 is an oblique view showing top and side surfaces of the holder for the opto-electric converter module of FIGS. 1A–1C, 2.

FIG. 5 is an oblique view of holder 32 that shows arc-shaped interface 54 that mechanically engages the outer surface of electrical interface 16 of module 6.

Figure 6:
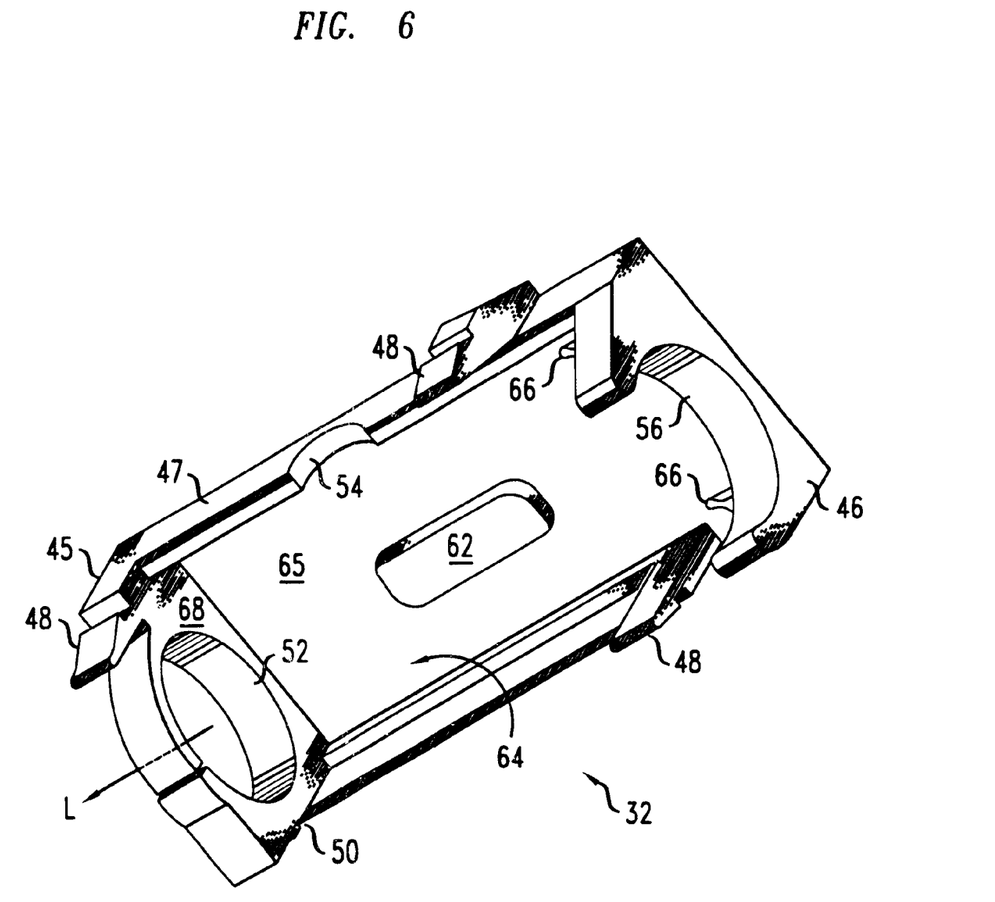
FIG. 6 is an oblique view showing an interior cavity of the holder for the opto-electric converter module of FIGS. 1A–1C, 2.

FIG. 6 is a bottom view of rectangular holder 32 showing a rectangular interior cavity 64. The interior cavity 64 has a lateral width designed to approximately equal the width of rectangular housing 8 of opto-electric module 6 and a length that 1–4 mm longer than that of the housing 8. The matching widths of the cavity 64 and housing 8 insure that the module 6 cannot turn about axis L after being inserted into the cavity 64. The length of the internal cavity 64 enables the housing 8 to be canted with respect to surface 65 during insertion into the holder 32. The cavity 64 includes two crushable plastic protrusions 66 that abut against end surface 10 of the housing 8 when fully inserted into the cavity 64. The protrusions 66 restrain longitudinal movement of the housing 8 along axis L after insertion. When fully mounted, end 9 of the rectangular housing 8 abuts against end surface 68.

Figure 7:
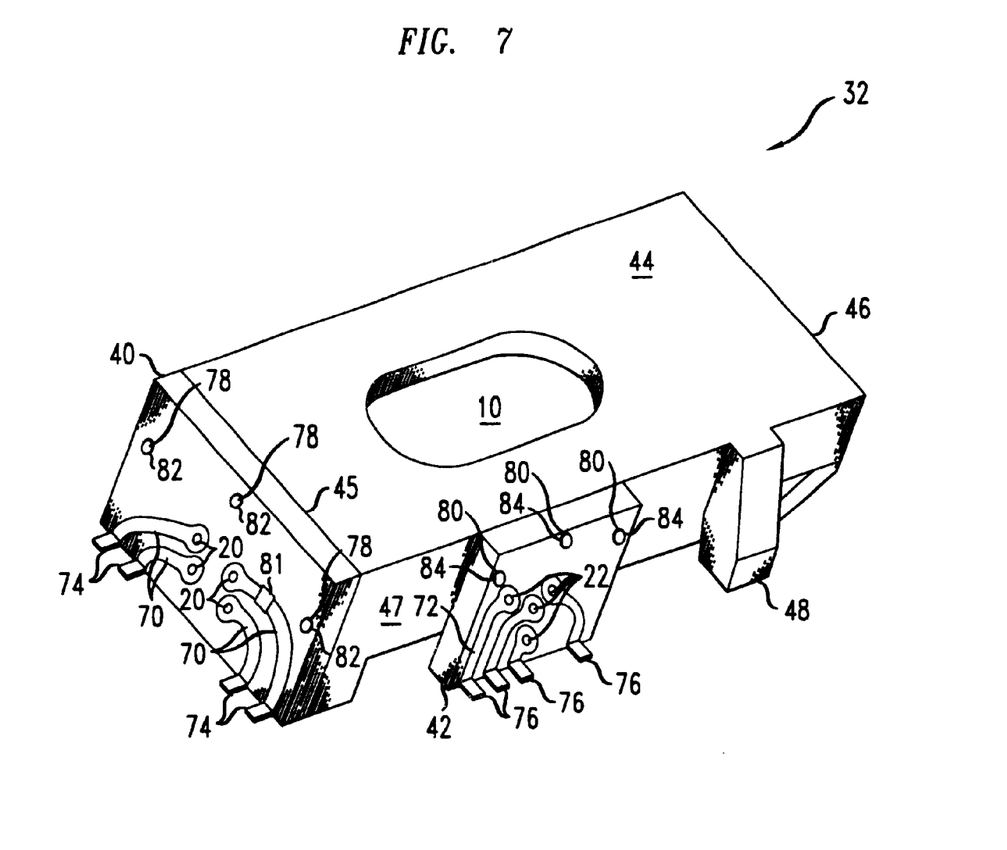
FIG. 7 is an oblique view showing the holder and connection boards as mounted on the transceiver circuit board of FIG. 2.

FIG. 7 is an oblique view of connection boards 40, 42 after holder 32 is locked onto transceiver circuit board 36 of FIG. 2. The connection boards 40, 42 are held at fixed positions and orientations with respect to the holder 32 by alignment pins 78, 80. The positions of the alignment pins 78, 80 on the holder 32 match with holes 82, 84 in the connection boards 40, 42. During mounting, the pins 78, 80 slide through matching holes 82, 84 in the boards 40, 42. After sliding through the holes 82, 84, protruding ends of the pins 78, 80 are heat expanded so that the connection boards 40, 42 cannot slide off the pins 78, 80. Locking the holder 32 to the circuit board 36 rigidly fixes the connection boards 40, 42 to abut against a top surface of circuit board 32.

The connection boards 40, 42 have metallic traces 70, 72 of copper or gold, which are deposited on their outer surfaces. Each trace 70, 72 covers an area around a hole where an electrical lead 20, 22 of module 6 protrudes through the connection board 40, 42. The hole patterns on the boards 40, 42 match lead patterns on interfaces 14, 16 of the module 6. The traces 70, 72 electrically connect the leads 20, 22 to connection pads 74, 76 located on the top surface of the circuit board 36.

The connection boards 40, 42 electrically connect optoelectric converter module 6 to transceiver circuit board 36 with leads 20, 22 whose soldered impedances are more reproducible than in prior art transceivers where the leads were bent and/or twisted to form the connections. Better reproducibility of these soldered impedances produces a more robust optical transceiver 30, because impedances of the transceiver circuit board 36 and the opto-electric converter module 6 can be better matched. Lead bending and/or twisting causes variability in lead impedances from one transceiver to another and would otherwise interfere with accurate impedance matching between the transceiver circuit board 36 and the opto-electric converter module 6.

In some embodiments, connection boards 40, 42 include circuit elements 81 of the optical transceiver 30 of FIG. 2. In exemplary embodiments, the circuit elements 81 are active elements such as diodes or transistors or passive elements such as inductors or capacitors. By placing the circuit elements 81 on the connection boards 40, 42, space is freed up on transceiver circuit board 36.

Individual traces 70, 72 form a pattern of contact areas along edges of connection boards 40, 42 adjacent the top surface of circuit board 36. The individual traces 70, 72 match to individual connection pads 74, 76 on the circuit board 36 so that leads 20, 22 are properly connected to the transceiver circuit board 36 when the connection pads 40, 42 are mounted.

Figure 8A:
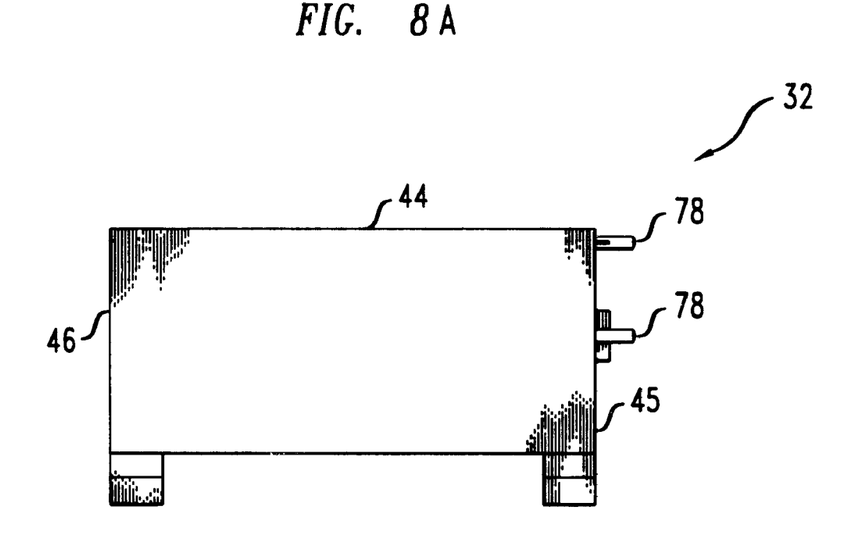
FIGS. 8A and 8B are side and top views of the holder for the opto-electric converter module of FIGS. 2–7 showing alignment pins for the connection boards.
Figure 8B:
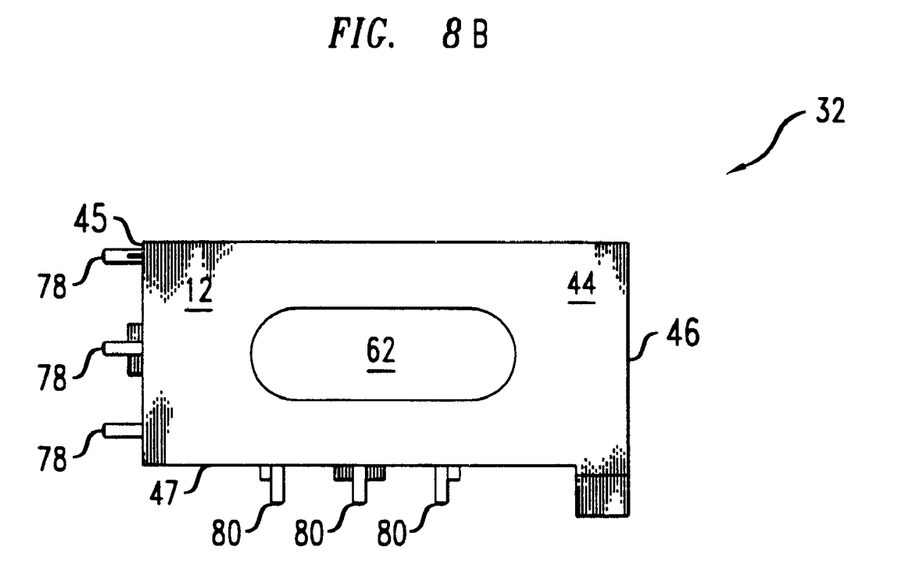

FIGS. 8A and 8B are respective side and top views of rectangular holder 32 that show alignment pins 78, 80 prior to mounting of connection boards 40,42. The pins 78, 80 have a cylindrical cross section that allow the pins 78, 80 to slide through holes in the connection boards 40, 42. After sliding the pins 78, 80 through the holes, distal portions of the pins 78, 80 are partially melted to widen ends so that the pins 78, 80 cannot slide back out of the holes. The alignment pins 78, 80 rigidly fix the connection boards 40, 42 to holder 32 so that the boards 40, 42 will not move and not cause damage to leads 20, 22 of opto-electric converter module 6 during mounting of the holder 32 on transceiver circuit board 36.

Figure 9:
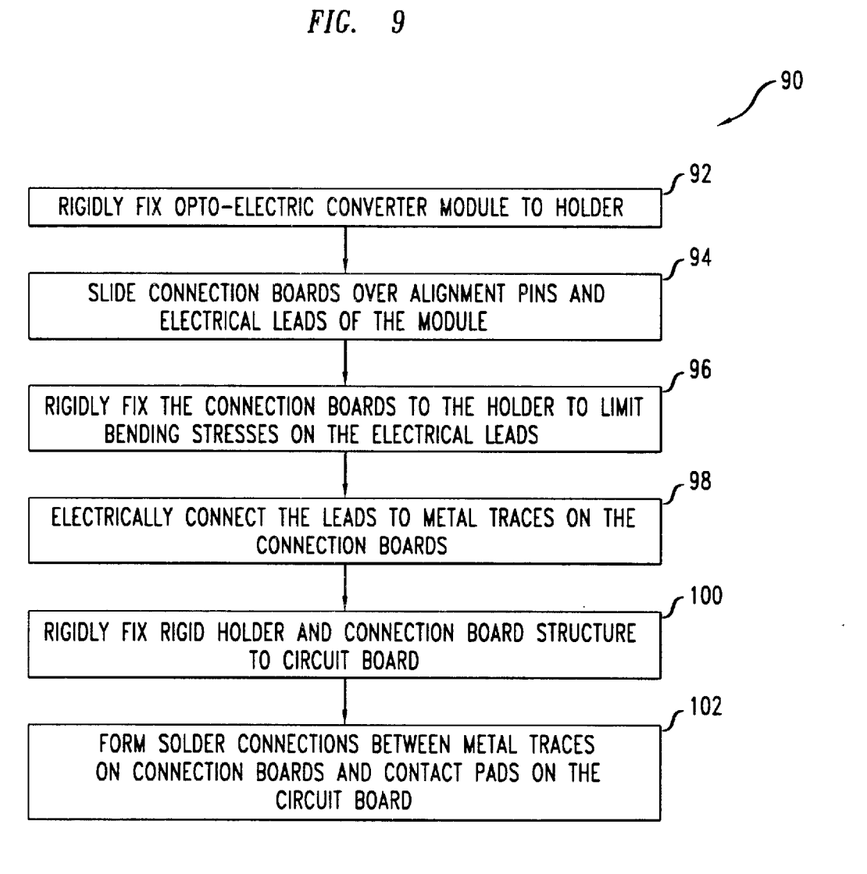
FIG. 9 is a flow chart for a process of mounting the opto-electric converter module of FIGS. 1A–1C, 2, 7 without bending or twisting the module's electrical leads.

FIG. 9 is a flow chart showing a process 90 that mounts opto-electric converter module 6 on transceiver circuit board 36 of FIGS. 2 and 7 without bending or twisting electrical leads 20, 22 of the module 6.

Process 90 mechanically engages housing 8 of optical receiver module 6 in plastic holder 32 without bending or twisting leads 20, 22 of the module 6 (step 92). After mechanical engagement, interfaces 52, 56, 54 and the interior shape of the holder 32 rigidly fix the module 6 so that relative movement cannot occur between the module 6 and the holder 32.

The mechanical interfaces 52, 54, 56 and interior cavity 64 of holder 32 are designed to rigidly hold the opto-electric converter module 6 of FIGS. 1A–1C. For opto-electric converter modules having different shapes, sizes, and/or external interfaces, the associated holders have different mechanical interfaces and/or interior cavity dimensions.

Next, the process 90 slides alignment pins 78, 80 into receiving holes 82, 84 in connection boards 40, 42 and electrical leads 20, 22 into other receiving holes in the boards 20, 22 (step 94). After sliding the boards 40, 42 over the pins 78, 80, the pins protrude through holes 82, 84, and the boards 40, 42 are positioned against surfaces 45, 47 of the holder 32. Sliding the leads 20, 22 into holes in the connection boards 40, 42 does not involve lead bending, because the leads 20, 22 slide straight through holes in the connection boards 40, 42 when the boards 40, 42 are aligned with the pins 78, 80.

After positioning connection boards 40, 42, process 90 rigidly fixes the boards 40, 42 to holder 32 (step 96). To fix the boards 40, 42, process 90 heat stakes or splits the pins 78, 80 so that the boards 40, 42 no longer slide on the pins 78, 80. Instead of heat staking or splitting the pins 78, 80, the process 90 may glue the connection boards 40, 42 to surfaces 45, 47 of the holder 32. After rigidly fixing the boards 40, 42, the holder 32, module 6, and boards 40, 42 form a rigid structure.

After rigidly fixing boards 40, 42 to holder 32, process 90 solders electrical leads 20, 22 of opto-electric module 6 to metal traces 70, 72 on the connection boards (step 98).

Process 90 rigidly fixes the holder 32 to the transceiver circuit board 36 by pushing locking tabs 48 and rigid edges 50 of the holder 32 into slots 34–35 in the transceiver circuit board 36 (step 100). After locking the tabs 48 and edges 50, the holder 32 and module 6 are rigidly fixed to the circuit board 36. Furthermore, connection boards 40, 42 are aligned so that individual metal traces 70, 72 line up with and make contact with individual contact pads 74, 76 on the circuit board 36.

After fixing holder 32 to circuit board 36, process 90 forms solder connections between metal traces 70, 72 and matching contact pads 74, 76 on the circuit board 36 (step 102). After the soldering, the opto-electric converter module 6 is both electrically and mechanically attached to the transceiver circuit board 36.

Rigidly fixing the connector boards 40, 42 to the holder 32 configures the boards 40, 42 and holder 42 to limit or remove bending stresses on electrical leads 20, 22 during subsequent fixing of the holder 32 to circuit board 36 and electrical connecting of the boards 40, 42 to contact pads 74, 76.

Since process 90 mounts opto-electric module 6 on transceiver circuit board 36 by sliding electrical leads 20, 22 into connection structures, the process 90 is easily automated. The automated process 90 does not control physical stresses on the leads 20, 22 based on measurements of such stresses, because the leads 20, 22 are not bent during assembly. The absence of physical stresses lowers the risk of damage to the opto-electric converter module 6 during assembly of optical transceiver 30.

Other embodiments of the invention will be apparent to those skilled in the art in light of the specification, drawings, and claims of this application.

What is claimed is:

1. A process, comprising:
   rigidly fixing an opto-electric converter module to a holder;
   connecting the module to a connection structure configured to slidably receive electrical leads of the module;
   rigidly fixing the holder and connected module to a circuit board; and
   then, electrically connecting the connection structure to the circuit board, the holder and connection structure being configured to limit bending stresses on the electrical leads during the acts of rigidly fixing the holder and connecting.

2. The process of claim 1, wherein the connection structure is rigidly fixed to the circuit board by the act of rigidly fixing the holder.

3. The process of claim 1, wherein the rigidly fixing the holder comprises:
   locking one or more flexible tabs of the holder into one or more slots in the circuit board.

4. The process of claim 3, wherein the locking aligns at least one metal trace on the structure with a contact pad on the circuit board.

5. The process of claim 1, wherein the connecting the module further comprises:
   sliding the electrical leads into matching holes in the connection structure without bending the leads.

6. The process of claim 1, wherein the connecting the module includes aligning the connection structure with respect to the holder by sliding a protrusion into a hole, one of the protrusion and the hole being located on the holder and the other of the protrusion and the hole being located on the connection structure.

7. The process of claim 6, wherein the electrically connecting the connection structure to the module further comprises:

soldering the electrical leads to the connection board.

8. The process of claim 6, further comprising:

rigidly fixing the aligned connection structure to the holder.

9. The process of claim 1, wherein the electrically connecting the connection structure to the circuit board includes forming a plurality of solder connections between the structure and contact pads on the circuit board.

10. The process of claim 1, wherein the rigidly fixing an opto-electric converter module to a holder includes engaging at least one interface of the module in a mechanical interface of the holder and pushing a portion of the module into a cavity in the holder.

11. An opto-electric apparatus, comprising:

a circuit board having a surface with electrical lines located thereon;

an opto-electric converter module having a plurality of electrical leads;

a holder rigidly holding the opto-electric converter module and being rigidly fixed to the circuit board; and at least one connection structure rigidly connected to the holder, a plurality of the electrical leads of the module protruding into holes in the structure, the connection structure connecting to the lines, the lines and connection structure being on the same side of the surface.

12. The apparatus of claim 11, further comprising:

at least one alignment pin engaged with a hole, one of the pin and the hole located on the structure and the other of the pin and the hole located on the holder.

13. The apparatus of claim 11, wherein the connection structure has a plurality of metal traces; and the circuit board has a plurality of contact pads located on a surface thereof, the traces electrically connecting the leads to the pads.

14. The apparatus of claim 13, further comprising:

at least one circuit element located on the connection structure and electrically connected to the opto-electric converter module by at least one of the traces.

15. The apparatus of claim 11, wherein the holder has at least two mechanical interfaces engaged with mechanical structures on the opto-electric converter module.

16. The apparatus of claim 11, wherein the holder has a cavity, a portion of the module being located in the cavity, the cavity configured to stop rotational motions of the module with respect to the holder.

17. The apparatus of claim 11, wherein the holder comprises plastic.

18. The apparatus of claim 11, wherein the plastic is capable of dissipating static charges.

19. The apparatus of claim 11, wherein the module is an optical transceiver with first and second electrical interfaces, the first and second electrical interfaces being located on respective first and second faces of a metal housing.

20. The apparatus of claim 11, wherein the connection structure includes a connection board.

* * * * *